(12) United States Patent
Masuda et al.

(10) Patent No.: US 8,591,655 B2
(45) Date of Patent: Nov. 26, 2013

(54) APPARATUS FOR THE PREPARATION OF FILM

(75) Inventors: Takeshi Masuda, Shizuoka-ken (JP); Masahiko Kajinuma, Shizuoka-ken (JP); Takakazu Yamada, Shizuoka-ken (JP); Hiroto Uchida, Kanagawa-ken (JP); Masaki Uematsu, Shizuoka-ken (JP); Koukou Suu, Chiba-ken (JP)

(73) Assignee: Ulvac, Inc., Kanagawa (JP)

( * ) Notice: Subject to any disclaimer, the term of this patent is extended or adjusted under 35 U.S.C. 154(b) by 153 days.

(21) Appl. No.: 10/612,149

(22) Filed: Jul. 3, 2003

(65) Prior Publication Data

US 2005/0199182 A1 Sep. 15, 2005

(30) Foreign Application Priority Data

Jul. 5, 2002 (JP) .................................. 2002-196930

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl.
USPC ...... 118/715; 118/728; 118/729; 156/345.54; 156/345.33; 156/345.34

(58) Field of Classification Search
USPC .................... 118/719, 715, 728, 729; 156/345.31–32, 345.51, 345.54
See application file for complete search history.

(56) References Cited

U.S. PATENT DOCUMENTS

| | | | | |
|---|---|---|---|---|
| 4,825,809 A * | 5/1989 | Mieno | ............................ | 118/725 |
| 5,558,717 A * | 9/1996 | Zhao et al. | ..................... | 118/715 |
| 5,884,009 A * | 3/1999 | Okase | ............................ | 392/418 |
| 6,155,200 A * | 12/2000 | Horiike et al. | ............. | 118/723 E |
| 6,817,377 B1 * | 11/2004 | Reimer et al. | ............ | 137/565.23 |
| 2005/0056217 A1 * | 3/2005 | Yamada et al. | ................ | 118/715 |
| 2005/0059246 A1 * | 3/2005 | Yamada et al. | ................ | 438/689 |

* cited by examiner

*Primary Examiner* — Rudy Zervigon
(74) *Attorney, Agent, or Firm* — Arent Fox LLP (57) ABSTRACT

A thin film-forming apparatus, for ensuring uniform plane distribution of properties of a film formed on a substrate surface, has a gas-supply port 24a supplying a gas mixture from a gas-mixing chamber 24 to a shower head 25. The port is arranged at the peripheral portion on the bottom face of the gas-mixing chamber so that the gas mixture flows from the upper peripheral region of the head towards the center thereof. An exhaust port 32 discharging the exhaust gas generated in the film-forming chamber 3 is arranged at a position lower than the level of a stage 31 during film-formation directing the exhaust gas towards the side wall of the chamber 3 and discharging the exhaust gas through the exhaust port. The stage 31 is designed to move freely up and down to adjust the distance between the shower head 25 and substrate S.

10 Claims, 4 Drawing Sheets

APPARATUS FOR THE PREPARATION OF FILM

BACKGROUND OF THE INVENTION

The present invention relates to an apparatus for the preparation of a thin film and, in particular, to an apparatus for the manufacture of a thin film, which can improve the distributions of, for instance, thickness, quality and composition of the resulting thin film on the surface of a wafer (or a substrate) when a film is formed according to the CVD technique such as the MOCVD technique.

Up to now, there have been proposed various kinds of techniques such as that for uniformly admixing a raw gas and a reactive gas; that for appropriately rotating a wafer to be processed during the formation of a film; and that for uniformly injecting gases onto the wafer through a shower head of a film-forming chamber, as means for improving the plane uniformity in the distributions of, for instance, thickness, quality and composition of the resulting thin film on the surface of a wafer, when a thin film is prepared according to the CVD technique, for instance, the MOCVD technique.

In the production of a thin film according to the MOCVD technique, it is common that a gas mixture comprising a vaporized raw material and a reactive gas is introduced into a film-forming chamber maintained at a vacuum and a vapor phase reaction of the gas mixture is induced on a substrate to be processed, which is placed on a stage disposed within the film-forming chamber to thus form a desired film on the substrate. On the top face of the film-forming chamber, a shower head is arranged, while it is opposed to the stage and a gas-mixing chamber is connected to the upstream side of the shower head. Upon the formation of a film according to such an MOCVD technique, the raw gas and the reactive gas fed to the gas-mixing chamber are admixed together therein and then introduced into film-forming chamber, which has been evacuated to a predetermined degree of vacuum, through the shower head in the form of a gas mixture having a predetermined and desired mixing ratio and the chemical reaction of these gases is induced on the substrate surface to thus form or deposit a film thereon.

The foregoing various kinds of conventional techniques proposed for the preparation of a thin film having uniform distribution of quality and thickness of a film thus formed on a substrate cannot be decisive means for solving the problems concerning the formation of a thin film, on a substrate, having, for instance, good uniformity in the quality and distribution of thickness, because of, for instance, the complicated structure of the currently used MOCVD apparatus and the difficulty in the formation of a uniform gas mixture. For this reason, there has been desired for the development of a CVD apparatus, which has a simple structure and which can variously be controlled so as to be in agreement with a variety of film-forming conditions.

SUMMARY OF THE INVENTION

Accordingly, it is an object of the present invention to solve the foregoing problems associated with the conventional techniques for preparing a thin film according to the CVD technique such as the MOCVD technique and more specifically to provide an apparatus for producing a thin film, which can easily ensure the uniform plane distribution of, for instance, the thickness, quality and composition of a film formed on the surface of a substrate or a wafer.

The inventors of this invention have investigated various kinds of combinations of different film-forming parameters such as the flow rates of gases to be supplied to a film-forming chamber of a CVD apparatus, the diameter of a shower head, the shower conductance, the speed for the evacuation of the film-forming chamber and the distance between the shower head and a substrate to be processed, in order to develop an apparatus for producing a film, which permits the improvement of the uniformity of, for instance, the thickness, quality and composition of the resulting film formed on the surface of a wafer. As a result, the inventors have found out such an information that the uniformity of properties on the wafer surface are greatly affected by factors, for instance, the way of supplying the shower head with a gas mixture, the direction of evacuating the film-forming chamber, the relation between the inner diameter of the film-forming chamber and the diameter of the shower head, the distance between the shower head and the substrate to be processed, the clearance for evacuation or exhaustion and the diameter of the gas injected into the film-forming chamber through the shower head and have thus completed the present invention.

According to an aspect of the present invention, there is provided a film-forming apparatus, which comprises a gas-mixing chamber for admixing a raw gas and a reactive gas, a film-forming chamber connected to the gas-mixing chamber, a shower head disposed on the top face of the film-forming chamber and a stage arranged in the film-forming chamber for placing a substrate to be processed and capable of freely going up and down and in which a gas mixture prepared in the gas-mixing chamber is introduced into the film-forming chamber through the shower head to thus form a film on the substrate, the apparatus being characterized in that the gas mixture prepared in the gas-mixing chamber is supplied to the shower head through a supply port disposed at the peripheral portion on the bottom face of the gas-mixing chamber so that the gas mixture prepared in the gas-mixing chamber and fed to the shower head through the peripheral portion on the top face of the shower head flows towards the center of the shower head. The use of such a structure would permit the development of an apparatus capable of ensuring the uniformity of, for instance, the thickness, quality and composition of the resulting film deposited on the wafer surface.

In the film-forming apparatus according to the present invention, an exhaust port for discharging an exhaust gas from the film-forming chamber is disposed on the side wall of the film-forming chamber and below the level of the stage at which the film is formed so that the exhaust gas generated in the film-forming chamber is directed and guided towards the side wall of the chamber and discharged through the exhaust port disposed on the side wall.

In the film-forming apparatus according to the present invention, when the flow rate of the gas mixture is large, the shower conductance is small and the gas mixture is injected into the film-forming chamber from the central portion of the shower head and into a region above a wafer or a substrate to be processed (hereunder also referred to as "central gas injection") upon the formation of a film, it is preferred to use a shower head having a large diameter, to increase the distance between the shower head and the substrate to be processed or to simultaneously use a shower head having a large diameter and increase the distance between the shower head and the substrate to be processed. In this connection, the term "the diameter of a shower head" herein used means the diameter of the gas injected into the film-forming chamber through the shower head. The use of such a structure would permit the prevention of such central gas injection and the equalization of the manner of the gas injection into the film-forming chamber. Accordingly, this would realize the uniform collision between gas molecules and the substrate surface and as a result, this in turn leads to the achievement of the uniform distributions of, for instance, the thickness, quality and composition of the film on the wafer surface.

Alternatively, if the flow rate of the gas mixture is low, the shower conductance is large and the gas mixture is injected into the film-forming chamber and into a region above a wafer or a substrate to be processed externally or from the periphery of the region (hereunder also referred to as "external or peripheral gas injection") upon the formation of a film, it is preferred to use a shower head having a small diameter, to reduce the distance between the shower head and the substrate to be processed or to simultaneously use a shower head having a small diameter and reduce the distance between the shower head and the substrate to be processed. The use of such a structure would permit the prevention of such peripheral gas injection and the equalization of the manner of the gas injection into the film-forming chamber. Accordingly, this would realize the uniform collision between gas molecules and the substrate surface and as a result, this in turn leads to the achievement of the uniform distributions of, for instance, the thickness, quality and composition of the film on the wafer surface.

In the film-forming apparatus according to the present invention, it is preferred to design the apparatus such that the inner diameter of the film-forming chamber and the diameter of the shower head satisfy the following relation:

(The diameter of the shower head)×1.5≤(The inner diameter of the film-forming chamber)≤(The diameter of the shower head)×2.5.

The uniformity of the collision between gas molecules and the substrate surface would principally be determined by the balance between the flow of the gas mixture from the peripheral portion on the upper face of the shower head towards the central portion (inside) thereof and the influence of the exhaust gas drawn towards the peripheral portion of the film-forming chamber on the lower side of the shower head. For this reason, the gas molecules never uniformly collide against the substrate surface unless the foregoing relation between the inner diameter of the film-forming chamber and the diameter of the shower head is satisfied and as a result, it is difficult to obtain a film having uniform distributions of, for instance, the film thickness, film quality and film composition on the wafer surface. In this connection, the foregoing relation holds true when the pressure in the film-forming chamber, the diameter of the shower head and the overall flow rate of the gas mixture upon the formation of the film satisfy the following relations, respectively:

2 Torr<(The pressure in the film-forming chamber)<10 Torr

The diameter of the substrate to be processed≤(The diameter of the shower head)×1.5

2500 sccm<(The overall flow rate of the gases)<7000 sccm

In the film-forming apparatus according to the present invention, it is preferred to establish the distance between the shower head (S) and the substrate (S) to be processed (S/S distance) in such a manner that the distance satisfies the following relation:

(S/S distance)×5≤(The diameter of the shower head)≤(S/S distance)×10

Unless the relation specified by the foregoing equation is satisfied, the gas molecules never uniformly collide against the substrate surface and as a result, it is difficult to obtain a film having uniform distributions of, for instance, the film thickness, film quality and film composition on the wafer surface. In this connection, the foregoing relation holds true when the pressure in the film-forming chamber, the diameter of the shower head and the overall flow rate of gases upon the formation of the film satisfy the following relations, respectively:

2 Torr<(The pressure in the film-forming chamber)<10 Torr

The diameter of the substrate to be processed≤(The diameter of the shower head)×1.5

2500 sccm<(The overall flow rate of the gases)<7000 sccm

In the film-forming apparatus according to the present invention, it is preferred to design the apparatus such that the clearance for exhaustion of this apparatus satisfies the relation represented by the following equation:

0.02 m³/s<Exhaustion Conductance<0.08 m³/s

If the exhaustion conductance does not satisfy the relation specified by the foregoing equation, the gas molecules never uniformly collide against the substrate surface and as a result, it is difficult to obtain a film having uniform distributions of, for instance, the film thickness, film quality and film composition on the wafer surface. In this connection, the foregoing relation holds true when the pressure in the film-forming chamber, the diameter of the shower head and the overall flow rate of the gas mixture upon the formation of the film satisfy the following relations, respectively:

2 Torr<(The pressure in the film-forming chamber)<10 Torr

The diameter of the substrate to be processed≤(The diameter of the shower head)×1.5

2500 sccm<(The overall flow rate of the gases)<7000 sccm

In the film-forming apparatus according to the present invention, it is also possible to dispose a gas ring at the periphery of the top face of the film-forming chamber so that an inert gas, which is not directly involved in the film formation, can uniformly be introduced into the film-forming chamber through the gas ring and along the inner wall surface (the peripheral portion) of the film-forming chamber.

The film-forming apparatus according to the present invention is preferably a thin film-forming apparatus in which a film is formed according to the MOCVD technique.

Furthermore, the film-forming apparatus according to the present invention comprises a load-lock chamber for stocking wafers conveyed from a wafer cassette in the atmospheric conditions; a film-forming chamber; a conveyer chamber positioned between the load-lock chamber and the film-forming chamber; a gas-mixing chamber for admixing a raw gas and a reactive gas positioned on the upstream side of the film-forming chamber; a shower head arranged on the top face of the film-forming chamber; and a stage arranged in the film-forming chamber for placing a substrate to be processed and capable of freely going up and down, in which a gas mixture prepared in the gas-mixing chamber is introduced into the film-forming chamber through the shower head to thus form a film on the substrate and the apparatus being characterized in that it is designed according to any one of the foregoing embodiments.

BRIEF DESCRIPTION OF THE DRAWINGS

FIG. 5 is a bottom plan view showing the positions and constructions of gas-injection holes of a shower head used in the thin film-forming apparatus of the present invention; (a) a shower head whose holes are distributed at a uniform density as a whole; (b) a shower head whose holes are distributed, as a whole, at a density (holes having a smaller diameter) lower than that observed for the holes in (a); (c) a shower head whose holes are distributed, as a whole, at a density (holes having a smaller diameter) higher than that observed for the holes in (a); (d) a shower head whose holes are distributed at a high density in the central area, at a medium density in an intermediate area and at a low density in the circumferential area; and (e) a shower head whose holes are distributed at a low density in the central area, at a medium density in an intermediate area and at a high density in the circumferential area.

DESCRIPTION OF THE PREFERRED EMBODIMENTS

According to an embodiment of the present invention, the thin film-forming apparatus comprises a load-lock chamber for stocking wafers (substrates to be processed) conveyed from a wafer cassette in the atmospheric conditions; a film-forming chamber consisting of a vacuum vessel; a conveying chamber positioned between the load-lock chamber and the film-forming chamber; a stage arranged in the film-forming chamber for placing a substrate to be processed and capable of freely going up and down; a shower head arranged on the top face of the film-forming chamber in such a manner that it is opposed to the stage; a gas-mixing chamber for supplying the shower head with a gas mixture comprising a raw gas and a reactive gas and positioned on the upstream side of the film-forming chamber; a temperature control device for heating or cooling the substrate to be processed and fitted to the stage; a gas supply system for the raw gas and that for the reactive gas connected to the gas-mixing chamber; a vacuum exhaust system for evacuating the film-forming chamber connected thereto; and a conveying means for sending in or carrying out the substrate to be processed and the apparatus is designed in such a manner that a gas mixture prepared in the gas-mixing chamber is introduced into the film-forming chamber through the shower head to thus form, on the substrate, a thin film having the desired in-plane uniformity of various physical properties.

Various embodiments of the thin film-forming apparatus according to the present invention will hereunder be described in more detail with reference to the accompanying drawings.

Figure 1:
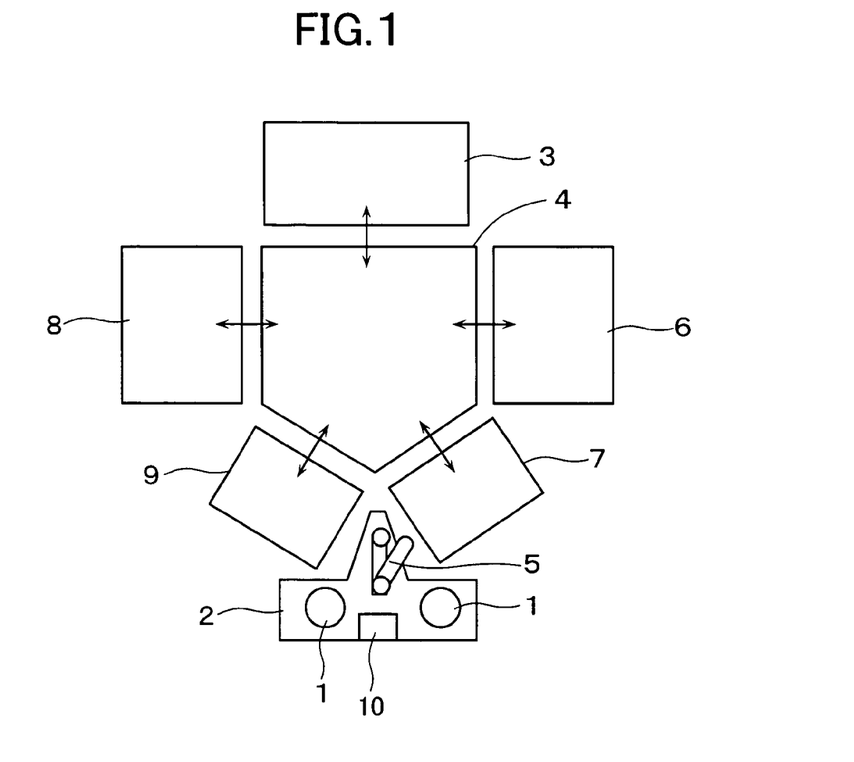
FIG. 1 is a block diagram schematically illustrating an embodiment of the overall structure of an apparatus including the thin film-forming apparatus according to the present invention.
Figure 2:
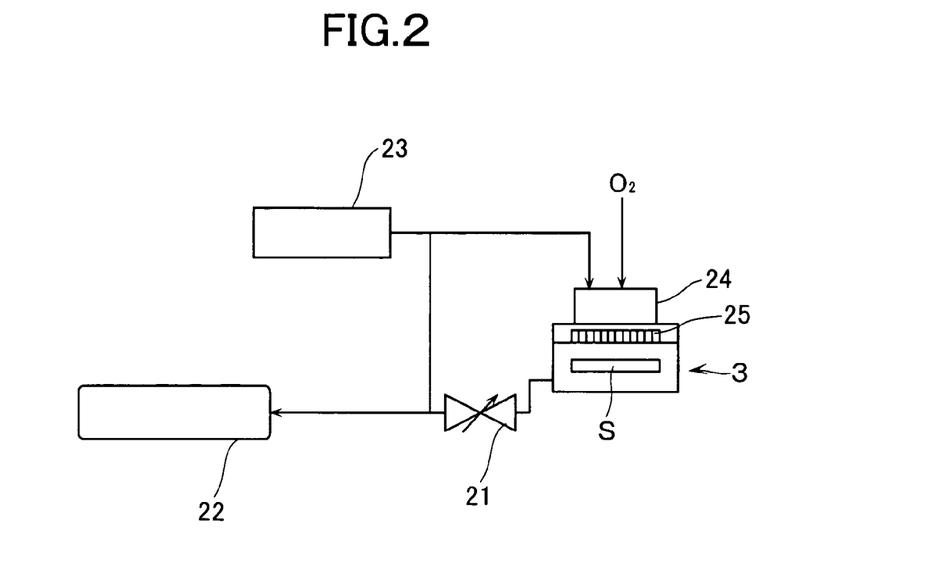
FIG. 2 is a schematic block diagram illustrating the circumference of the film-forming chamber of the apparatus as shown in FIG. 1.
Figure 3:
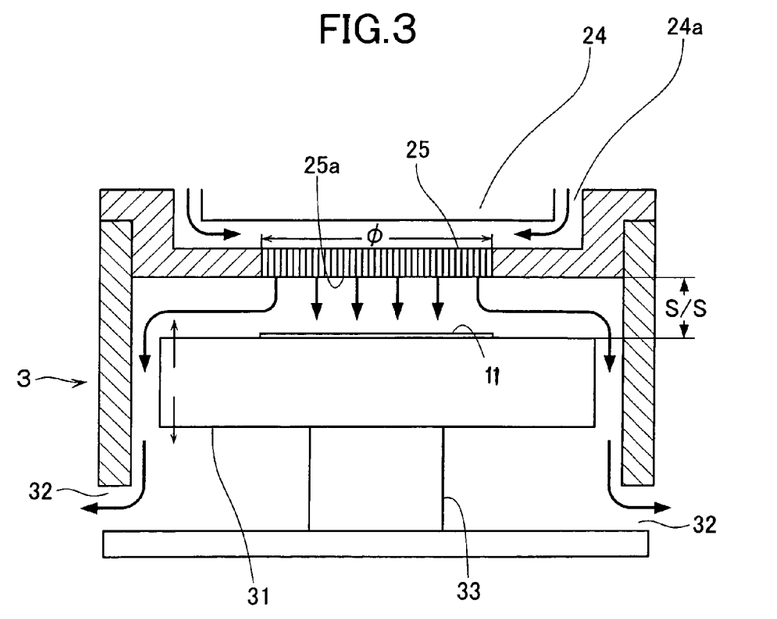
FIG. 3 is a schematic block diagram illustrating the interior of the film-forming chamber of the apparatus as shown in FIG. 1.

As shown in, for instance, FIG. 1, the thin film-forming apparatus according to the present invention comprises a load-lock chamber 2 for stocking wafers conveyed from a wafer cassette 1 under the atmospheric conditions, a film-forming chamber 3, a conveyer chamber 4 disposed between the load-lock chamber 2 and the film-forming chamber 3 and chambers 6, 7, 8 and 9 such as other film-forming chambers. In this respect, FIG. 2 shows the structure or construction in the vicinity of the film-forming chamber 3 of the apparatus as shown in FIG. 1 and FIG. 3 shows the interior of the film-forming chamber 3 of the apparatus as shown in FIG. 1 during the formation of a film. In FIGS. 1 to 3, the same components are specified or represented by the same reference numerals or symbols, respectively.

The load-lock chamber 2 and the film-forming chamber 3 are connected to one another through a partition valve. The load-lock chamber 2 plays a role such that a substrate to be processed whose film-forming surface is covered with a metal thin film formed is once exposed to vacuum atmosphere to thus remove, for instance, the moisture possibly present on the surface of the substrate. For this reason, a vacuum pump is connected to the load-lock chamber 2, the latter is provided with a vacuum gauge for monitoring the degree of vacuum in the chamber and it is also provided with a conveyer arm for transporting a substrate holder to which a substrate to be processed is fitted (these components are not shown in the attached figures). In this connection, the rotation axis of the conveyer arm can freely go up and down at a small stroke in order to deliver the substrate holder to which a substrate to be processed is fitted. Thus, a substrate to be processed, which is fitted to the substrate holder, is transported from the exterior (the wafer cassette) and accommodated in the load-lock chamber 2 by the action of the conveyer arm, the load-lock chamber 2 is evacuated to a desired degree of vacuum, the partition valve is opened and then the substrate fitted to the substrate holder is transported to the film-forming chamber 3 through the conveyer chamber 4 evacuated to the same degree of vacuum, likewise by the action of the conveyer arm. Thereafter, the conveyer arm is again returned back to the load-lock chamber 2 and then the partition valve is closed. In FIG. 1, the reference numeral 10 represents a wafer liner for adjusting the position and angle of each wafer.

Similar to the load-lock chamber 2, the film-forming chamber 3 is also equipped with a vacuum pump for allowing the establishment of a vacuum within the film-forming chamber and a vacuum gauge for monitoring the degree of vacuum thereof. In this respect, the vacuum pump may be connected to the film-forming chamber through a valve. In other words, as shown in FIG. 2, the film-forming chamber 3 is connected to an evacuation means 22 through a partition valve 21 and this evacuation means thus permits the evacuation of the film-forming chamber 3 and the establishment of a desired degree of vacuum therein.

In addition, as shown in FIG. 2, a mixing chamber 24 arranged in the proximity to and connected to the film-forming chamber 3 is connected to a gas mixture-supply system. This gas mixture-supply system consists of a raw gas-supply system for supplying the mixing chamber 24 with a raw gas through a vaporizer 23 and a reactive gas-supply system for supplying a reactive gas ($O_2$). The gases supplied through these gas-supply systems are admixed in the mixing chamber 24 and the resulting gas mixture is introduced into the film-forming chamber 3 through a shower head 25.

As shown in FIG. 1, a substrate to be processed is first transported to the load-lock chamber 2 using a robotized conveyer arm 5 and the load-lock chamber 2 is evacuated (to an ultimate pressure of up to about 5 Pa). Then the partition valve positioned between the load-lock chamber 2 and the conveyer chamber 4 evacuated to a vacuum almost identical to that of the chamber 2 is opened to thus unite these chambers 2 and 4. Thereafter, the pressure in the conveyer chamber 4 is controlled by letting an inert gas such as $N_2$ gas flow through the chamber 4 so that the pressure is higher than 665 Pa, which is the pressure in the film-forming chamber 3 during the formation of a film, to thus prevent the gas mixture present in the film-forming chamber 3 from flowing in the conveyer chamber 4. At this stage, the substrate to be processed is transferred from the load-lock chamber 2 to the conveyer chamber 4 and the partition valve between the conveyer chamber 4 and the film-forming chamber 3 is then opened to convey the substrate to the film-forming chamber 3, while the foregoing pressure conditions are maintained.

As shown in FIG. 3, the substrate 11 to be processed is conveyed onto a wafer stage 31 positioned within the film-forming chamber 3 and then the stage is raised till the distance between the shower head and the substrate reaches the predetermined level (S/S distance in general ranging from about 15 to 50 mm). The substrate 11 transported to the stage 31 is heated from room temperature to the film-forming temperature since the stage is heated by a heating means. The overall time required for heating the substrate from room temperature to the film-forming temperature and for stabilizing the latter is in general about 4 minutes.

After the temperature of the substrate is stabilized, a raw gas (real gas) vaporized by the vaporizer 23 (see FIG. 2) and a reactive gas (for instance, $O_2$ gas) are introduced into a gas-mixing chamber 24 and the resulting gas mixture having a desired mixing ratio is fed to the region above the substrate placed on the stage 31 in the film-forming chamber 3 through a gas-supply port 24a and the shower head 25 to thus initiate the formation of a film.

In this connection, the gas mixture is introduced into the film-forming chamber over a time required for forming a film having a desired thickness (for instance, about 100 nm), which varies depending on the flow rate of the gas mixture, the diameter of the shower head (or the diameter of the portion through which the gas mixture is injected) and the shower head-substrate distance.

After the film-forming procedures are continued till a film having a desired thickness is formed, the introduction of the gas mixture is interrupted, the stage 31 is brought down to a level at which the substrate can be delivered to the conveyer chamber 4 and the substrate thus processed is conveyed from the film-forming chamber 3 to the conveyer chamber 4 to thus recover the substrate. This conveyer chamber 4 has been subjected to pressure control as previously discussed above.

As has been described above, the MOCVD apparatus as shown in FIG. 3 comprises a gas-mixing chamber 24, a film-forming chamber 3 connected to the gas-mixing chamber 24 and a shower head 25 disposed on the top face of the film-forming chamber, wherein a stage 31 for placing a substrate S to be processed is arranged within the film-forming chamber 3 in such a manner that it is opposed to the shower head 25. The film-forming apparatus having such a structure permits the preparation of a thin film on the substrate S by the introduction of a gas mixture prepared in the gas-mixing chamber 24 into the film-forming chamber 3 through the shower head 25. An outlet (also the gas supply port) 24a for the gas mixture (a port for supplying the shower head with the gas mixture) is positioned at a peripheral portion on the bottom of the gas-mixing chamber 24 so that the gas mixture prepared in the gas-mixing chamber 24 and fed to the shower head 25 flows from the outer or external periphery (marginal portion) of the shower head towards the center thereof on the upper face of the head.

An exhaust port 32 is formed on the side wall of the film-forming chamber 3 below the level of the stage 31 upon the formation of a film so that the exhaust gas is directed towards the periphery of the film-forming chamber 3 during the film-formation. More specifically, the exhaust gas flows along the inner wall of the film-forming chamber and ultimately externally discharged from the film-forming chamber.

In the foregoing film-forming chamber 3, the stage 31 is designed such that it can freely go up and down by an elevating means 33 to thus set the film-forming position at any level or that the distance between the shower head 25 and the substrate S to be processed can be adjusted.

As has been discussed above, the gas flow on the top face of the shower head 25 is designed such that it is directed from the peripheral portion to the central portion of the head and the exhaust gas flow is designed such that it is directed towards the peripheral portion of the film-forming chamber 3. Accordingly, one can sufficiently cope with changes extending from the central injection (in cases where the gas flow rate is high and the shower conductance is small) to the peripheral injection (in cases where the gas flow rate is small and the shower conductance is high) observed when the flow rate of the gas mixture and the shower conductance are changed, by appropriately selecting or adjusting, for instance, the diameter of the shower head as has been described above.

As has been discussed above, any uniform collision of gas molecules with the substrate (and in its turn, uniform distributions of various physical properties on the wafer surface) can be ensured by controlling the distance (S/S distance) between the shower head and the substrate (wafer) in addition to the control of the passage of the gas mixture and the evacuation direction thereof. For instance, in the case of the central gas injection, an increase in the S/S distance would permit the achievement of the uniform distributions of various physical properties on the wafer surface, while in the case of the peripheral gas injection, the reduction of the S/S distance would permit the achievement of the uniform distributions of various physical properties on the wafer surface.

According to the present invention, as previously described above, various physical properties of the resulting film can uniformly be distributed on the wafer surface by the combination of the establishment of a gas mixture flow from the upper peripheral portion towards the central portion of the shower head 25 and the gas-evacuation direction of the exhaust gas along the lower internal wall of the film-forming chamber 3 and further the control of the S/S distance.

In addition, in the present invention, it is preferred that the gas injection diameter of the shower head 25 is at least equal to or higher than the diameter of the substrate to be processed in order to achieve the uniform distributions of various physical properties on the wafer surface. Incidentally, the shower head 25 used herein is one having a desired diameter in proportion to the size of the substrate to be processed, but it is also possible to use a shower head, which is so designed that the superfluous gas injection holes 25a can be closed to obtain a desired gas-injection diameter depending on the size of the substrate to be processed. More specifically, the shower head 25 can be designed in such a manner that the diameter (gas-injection diameter) thereof may freely be controlled.

Figure 5:
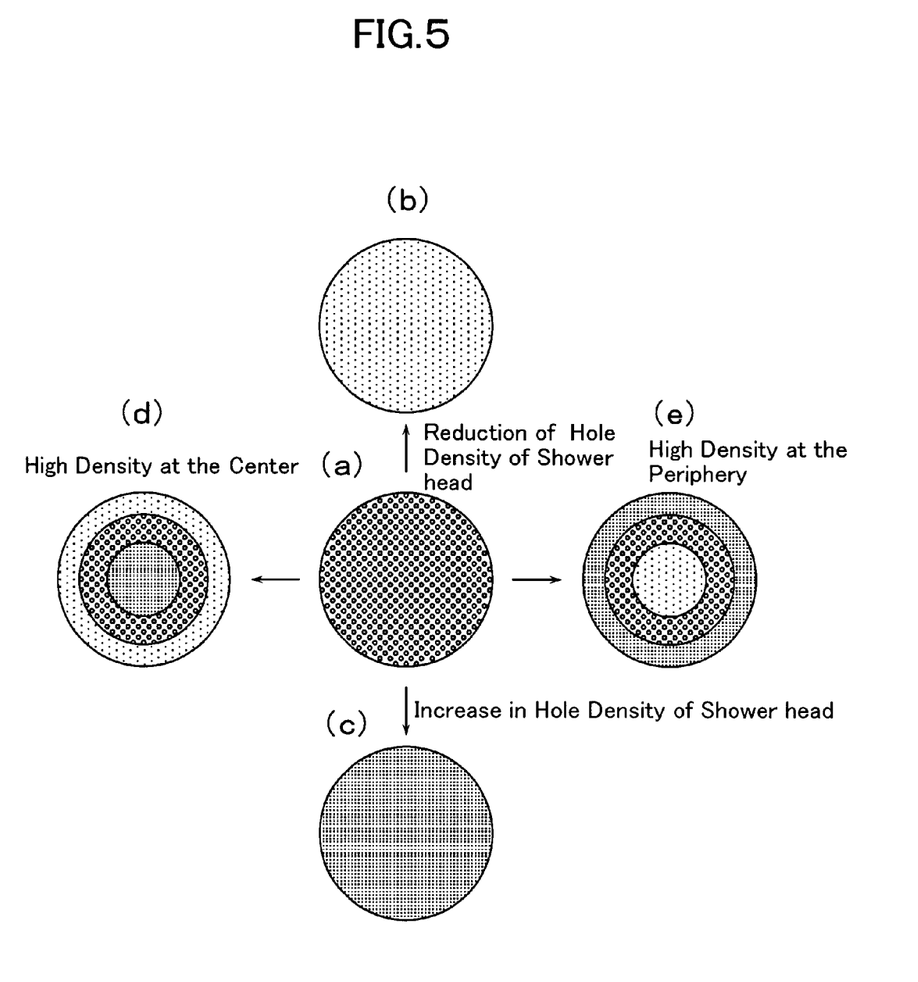

Moreover, the shower head used in the apparatus according to the present invention is not particularly limited in the shape of the head and the shape and density of the gas-injection holes thereof inasmuch as it permits the uniform introduction of the gas mixture into the film-forming chamber. For instance, the shower head may be one as shown in FIG. 5(a) in which gas-injection holes are uniformly distributed throughout the head or ones as shown in FIGS. 5(b) to 5(e) in which the density of gas-injection holes or the diameter thereof formed on the head varies or has a certain distribution, depending on the flow rate of the gas mixture and the evacuation speed of the vacuum pump. In FIG. 5, (b) shows a shower head whose holes are distributed, as a whole, at a density (holes having a smaller diameter) lower than that observed for the holes depicted on FIG. 5(a); (c) shows a shower head whose holes are distributed, as a whole, at a density (holes having a smaller diameter) higher than that observed for the holes depicted on FIG. 5(a); (d) shows a shower head whose holes are distributed at a high density in the central area, at a medium density in an intermediate area and at a low density in the circumferential area; and (e) shows a shower head whose holes are distributed at a low density in the central area, at a medium density in an intermediate area and at a high density in the circumferential area. However, the present invention is not restricted to these specific ones and the shower head may appropriately be designed or modified. For instance, the shower heads as shown in FIGS. 5(d) and 5(e) out of those shown in FIG. 5 may be plate-like shower heads formed by concentrically combining a plurality of torus bodies having different inner diameters and different gas-injection hole densities.

A thin film-manufacturing process, which makes use of the thin film-forming apparatus of the present invention, can be put into practice according to the foregoing processes and in the thin film-manufacturing process according to the MOCVD technique and using a thin film-forming apparatus as shown in FIG. 3, the intended purposes of the present invention may be ensured by the use of the following film-forming conditions for the production of, for instance, a ferroelectric PZT film:

Flow Rate of Gases:
  Reactive Gas ($O_2$): 1000 to 5000 sccm;
  Carrier Gas: 300 sccm;
  Flow Rate of Raw Gases:
    0.3M-Pb(DPM)$_2$/THF: 0.09 to 0.9 mL/min,
    0.3M-Zr(DMHD)$_4$/THF: 0.06 to 0.6 mL/min and
    0.3M-Ti(i-PrO)$_2$(DPM)$_2$/THF: 0.06 to 0.6 mL/min
Temperature during Film-Formation: 450 to 650° C.
Pressure during Film-Formation: 266 to 1330 Pa
Substrate: There is not any particular restriction. Specific examples thereof usable herein are Ir/SiO$_2$/Si substrates, SiO$_2$/Si substrates and Si substrates. Moreover, with respect to the size of the substrate, those having Φ 8 inches and 6 inches may be used in the same apparatus and under the same film-forming conditions to thus ensure the uniformities of various physical properties of the resulting film such as the film thickness on the substrate surface.

In this respect, if the flow rate of the raw material having a concentration of 0.3 mole/L is less than the lower limit specified above, the resulting film-forming rate is too late and thus it takes a lot of time to form a film, while if the flow rate thereof exceeds the upper limit, the raw material cannot skillfully be vaporized and deposits are formed in the vaporizer.

Figure 4:
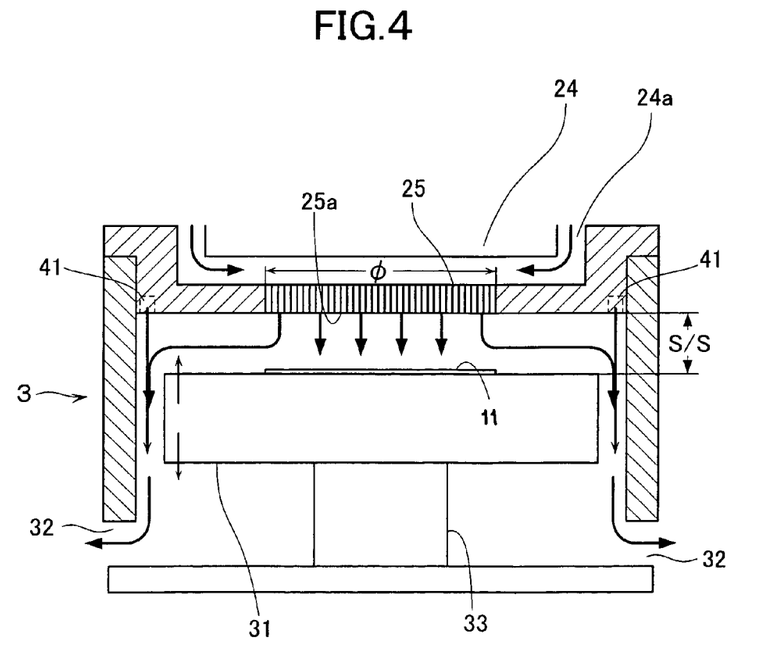
FIG. 4 is a schematic block diagram illustrating the interior of the film-forming chamber of the apparatus according to another embodiment of the present invention.

According to another embodiment of the thin film-forming apparatus of the present invention, a gas ring 41 may be disposed at the upper peripheral portion of the film-forming chamber 3 as shown in FIG. 4, in order to uniformly introduce, into the film-forming chamber, an inert gas such as $N_2$ or Ar, which is not directly involved in the film-formation, along the inner wall (marginal portion) of the film-forming chamber 3. The introduction of such an inert gas into the film-forming chamber may contribute to the control of the flow (or to rectified flow) of the gas mixture in the chamber and this in turn makes it possible to improve the uniformity of the distributions of, for instance, the film thickness, film quality and film composition on the wafer surface. In FIG. 4, the components identical to those shown in FIG. 3 are represented by the same reference numerals or symbols used in FIG. 3.

As has been discussed above in detail, the thin film-forming apparatus according to the present invention is designed in such a manner that a gas-supply port for supplying a gas mixture prepared in a gas-mixing chamber to a shower head is arranged at the peripheral portion on the bottom face of the gas-mixing chamber so that the gas mixture from the gas-mixing chamber flows from the upper peripheral region of the head towards the center thereof and the apparatus is further so designed that an exhaust port for discharging the exhaust gas generated in the film-forming chamber is arranged at a position lower than the level of a stage during film-forming operations to thus direct the exhaust gas generated in the film-forming chamber towards the side wall of the chamber and to discharge the exhaust gas through the exhaust port disposed on the side wall thereof. Accordingly, when a film is prepared, the apparatus of the present invention can substantially improve the uniformity of the distributions of, for instance, the film thickness, film quality and film composition on the wafer surface.

EXAMPLE

The thin film-forming process, which makes use of the thin film-forming apparatus of the present invention, will hereunder be described in more detail with reference to the following Examples explained below while referring to the accompanying drawings.

Example 1

In this Example, a ferroelectric PZT thin film was prepared using either of the thin film-forming apparatuses as shown in FIGS. 1 to 3 in which a thin film is formed according to the MOCVD technique.

In the apparatuses as shown in FIGS. 1 to 3, the following variables were set at the levels specified below:
  Diameter of Shower Head 25: 150 to 250 mm;
  Number of Holes Formed through Shower Head 25: 3000 holes/Φ250;
  Conductance of Shower Head 25 per Unit Area (1 m$^2$): 7.3 m$^3$/s; and
  Distance Between Shower Head 25 and Substrate: 15 to 45 mm.
Such a shower head 25 used herein was one having a uniform hole density as shown in FIG. 5(a).

In addition, the following film-forming conditions were used herein:
Flow Rate of Gases:
  Reactive Gas ($O_2$): 2500 sccm;
  Carrier Gas ($N_2$): 300 sccm;
  Flow Rate of Liquid Raw Materials:
    0.3M-Pb(DPM)$_2$/THF: 0.3 mL/min,
    0.3M-Zr(DMHD)$_4$/THF: 0.2 mL/min and
    0.3M-Ti(i-PrO)$_2$(DPM)$_2$/THF: 0.2 mL/min
Temperature during Film-Formation: 600° C.
Pressure during Film-Formation: 665 Pa
Substrate: Ir/SiO$_2$/Si substrate having a diameter of 8 in.

(Note):
DPM: di-pivaloyl methanato, $C_{11}H_{19}O_2$;
THF: tetrahydrofuran, $C_4H_8O$;
DMHD: dimethyl heptadionato, $C_7H_{13}O_2$;
i-PrO: isopropoxy group The film-forming process was put in practice as follows:

The film-forming chamber 3 of the foregoing apparatus was evacuated and in this respect, the ultimate pressure was set at a level on the order of 5 Torr. Moreover, pipes for guiding the gases to the film-forming chamber 3, the vaporizer 23 and the gas-mixing chamber 24 were set at a temperature ranging from 200 to 250° C. and the wafer stage 31 was set at a temperature of 600° C.

The reactive gas was introduced into the film-forming chamber 3 at a flow rate of 2500 sccm and the pressure in the chamber was controlled to 665 Pa by APC, in advance.

As shown in FIG. 1, a substrate to be processed was first transported from the wafer cassette 1 to the load-lock chamber 2 using the robotized conveyer arm 5 and then the load-lock chamber 2 was evacuated (to an ultimate pressure on the order of about 5 Pa). Thereafter, the partition valve arranged between the load-lock chamber 2 and the conveyer chamber 4, which had been evacuated to the same degree of vacuum used in the chamber 2, was opened to thus unify the load-lock chamber 2 and the conveyer chamber 4. On the other hand, the pressure in the conveyer chamber 4 was controlled by letting $N_2$ gas flow through the chamber 4 in such a manner that the pressure was higher than that established in the film-forming chamber 3 or 665 Pa to thus prevent the gas mixture present in the film-forming chamber 3 from flowing into the conveyer chamber 4. At this stage, the substrate to be processed was transported from the load-lock chamber 2 to the conveyer chamber 4 and subsequently to the film-forming chamber 3 after the partition valve positioned between the conveyer chamber 4 and the film-forming chamber 3 was opened. The exhaust gas generated in the film-forming chamber 3 was discharged by the exhaust means 22 as shown in FIG. 2.

After the substrate to be processed is transported to the wafer stage 31 arranged within the film-forming chamber 3, then, as shown in FIG. 3, the stage is ascended by the action of the means 33 for going the stage up and down till the shower head-substrate distance (S/S distance ranging from 15 to 45 mm) reached its predetermined level. The substrate transported to the stage 31 was heated from room temperature to a temperature used for film-formation (600 C) by the sensible heat from the stage 31, which was heated by a heating means. In this respect, it was found that the overall time required for raising the temperature of the substrate from room temperature to the film-forming temperature and for stabilizing the film-forming temperature was on the order of 4 minutes.

After the stabilization of the film-forming temperature, a gas mixture comprising a raw gas and a reactive gas was fed to the region above the substrate placed on the stage 31 in the film-forming chamber 3 through the gas mixture outlet 24a and the shower head 25 to thus initiate the film-forming operation. The gas mixture prepared in the gas-mixing chamber 25 and then fed to the shower head 25 flew, on the upper face of the shower head 25, from the outer periphery to the center of the head. The introduction of the gas mixture into the film-forming chamber 3 was continued till the thickness of the resulting film reached about 100 nm.

After the film-forming operation was continued till the thickness of the resulting film reached a predetermined level, the introduction of the gas mixture was interrupted, the stage 31 was then descended to the level capable of delivering the substrate to the conveyer chamber 4 and the substrate thus processed was transported from the film-forming chamber 3 to the conveyer chamber 4 to thus recover the substrate. The pressure of the conveyer chamber 4 was controlled in the same manner used above.

The exhaust gas generated during the film-formation ran along the inner wall of the film-forming chamber 3 and finally externally discharged from the film-forming chamber 3 through the exhaust port 32 arranged on the side wall of the film-forming chamber 3.

Thus, it was confirmed that the apparatus or the foregoing method permitted the continuous formation of films, on substrates, each having a uniform thickness, which had a uniform plane distribution on the wafer surface. This would in turn lead to the improvement of the yield of semiconductor chips.

Figure 6:
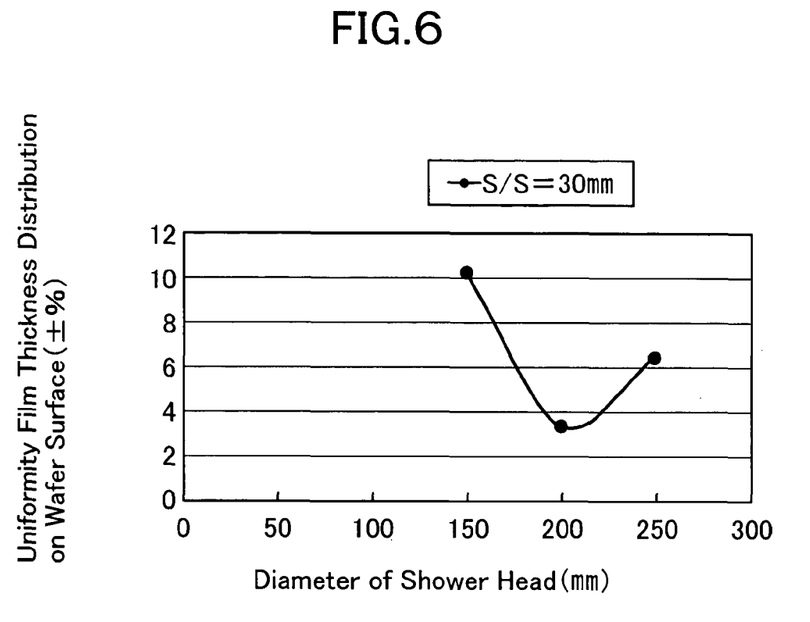
FIG. 6 is a graph showing the relation between the diameter of the shower head used in the present invention and the in-plane film thickness distribution (±).

The foregoing film-forming process was repeated by fixing the S/S distance (shower head-to-stage (substrate) distance) to 30 mm and by variously changing the shower head diameter to 150, 200 and 250 mm to thus determine the thickness distribution of the resulting films. The results thus obtained are plotted on the attached FIG. 6. From the results plotted on FIG. 6, it may be recognized that the gas mixture flows, in high amount, in the region above the wafer from the outside thereof and the resulting thickness distribution is unsatisfied for the shower head diameter of 250 mm, while the flow of the gas mixture is focused or concentrated on the center of the wafer and the resulting thickness distribution is likewise unsatisfied for the shower head diameter of 150 mm. Accordingly, it was found that the thickness distribution was highly acceptable when the shower head diameter is 200 mm, which is almost identical to that of the diameter of the wafer and this clearly indicates that the optimum value thereof exists in the proximity to this value.

In addition, the foregoing film-forming process was likewise repeated by variously changing the S/S distance while the shower head diameter was fixed to Φ50,200 and 250 mm to thus determine the thickness distribution of the resulting films. The results thus obtained are plotted on the attached FIG. 7. From the results plotted on FIG. 7, it may be recognized that there is observed a minimum point in the thickness distribution on the wafer surface when the S/S distance is changed for each shower head diameter or that the film thickness distribution on the wafer surface caused due to the manner of gas-injection from the shower head can be controlled by appropriately adjusting the S/S distance.

Figure 7:
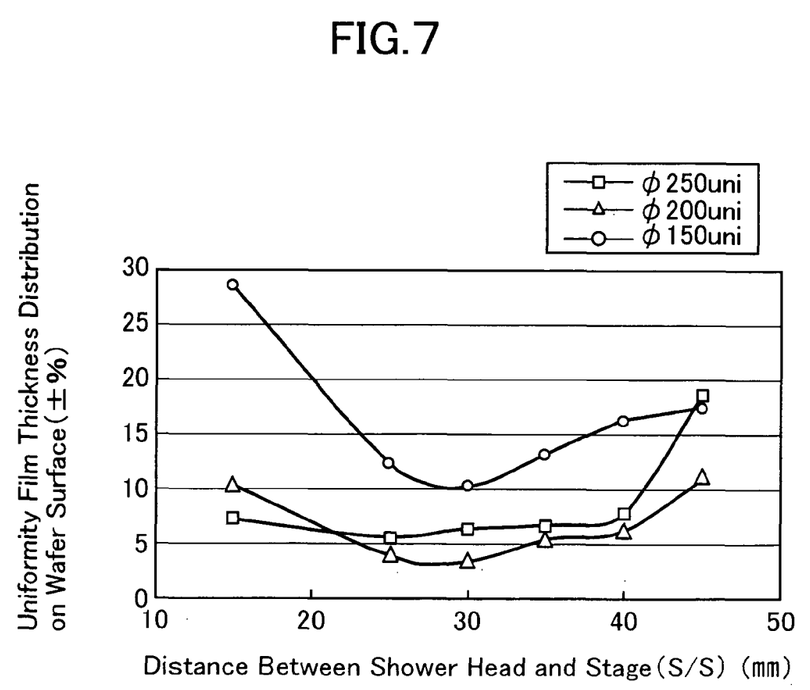
FIG. 7 is a graph showing the relation between the shower head-to-wafer stage (substrate) distance and the in-plane film thickness distribution (±) observed for a variety of diameters of the shower head used in the present invention.

The results plotted on FIG. 7 further indicate that the film thickness distribution on the wafer surface can be controlled by adjusting the S/S distance to a level generally ranging from 15 to 45 mm, preferably 20 to 40 mm and more preferably 25 to 35 mm, under the foregoing apparatus-operation conditions and the film-forming process conditions.

Example 2

The shower head 25 used in Example 1 was one whose gas-injection holes 25a were uniformly distributed throughout the cross-section of the shower head (see FIG. 5(a)), while the same procedures used in Example 1 were repeated except for using shower heads such as those depicted on FIGS. 5(b) to 5(e) in which the hole density thereof was changed or the hole density thereof had a distribution depending on the flow rates of the gas mixture and the exhaustion speed of the pump. As a result, it was found that the same results observed in Example 1 were obtained.

Example 3

The same procedures used in Example 1 were repeated except that a film-forming chamber provided with a gas ring 41 as shown in FIG. 4 was substituted for the film-forming chamber 3 used in Example 1 and that an inert gas such as $N_2$ or Ar was passed through the film-forming chamber in such a manner that the inert gas flew along the side wall of the film-forming chamber. As a result, it was found that the gas mixture flew as a more rectified flow to thus give a more preferred film thickness distribution.

What is claimed is:

1. A film-forming apparatus comprising: a gas-mixing chamber for admixing a raw gas and a reactive gas; a film-forming chamber connected to the gas-mixing chamber; a gas mixture supply port defining a dimensionally constant clearance between a bottom portion of the gas-mixing chamber and a circular shower head and positioned at a periphery of the bottom portion of the gas-mixing chamber; the circular shower head disposed at a top face of the film-forming chamber and having a plurality of gas-injection holes defined therethrough, each gas-injection hole directly opposing the gas-mixing chamber; a stage for placing thereon a substrate to be processed, the stage being disposed inside the film-forming chamber and moveable in an up and down manner; an exhaust port for discharging an exhaust gas from inside the film-forming chamber to outside of the film-forming chamber, the exhaust port being formed through a wall surface of the film-forming chamber in a position below the stage at a time of film formation, the exhaust gas generated in a space defined by the shower head and an upper face of the stage is discharged out of the exhaust port through a clearance between a side wall of the film-forming chamber and the stage; and a gas mixture initially prepared in the gas-mixing chamber being introduced into the film-forming chamber through the shower head, thereby forming a film on the substrate to be processed, wherein the gas mixture supply port is in fluid communication with the gas-mixing chamber and the shower head and is located on a radially extending line of the shower head, and wherein the gas mixture supply port is so constructed and arranged that the gas mixture to be supplied from the gas-mixing chamber freely flows through the dimensionally constant clearance along an upper surface of the shower head directly from the gas mixture supply port onto the upper surface of the shower head in direct contact with, and only from outside a circumferential outer perimeter of, the upper surface of the shower head and the gas-injection holes toward a central portion along the upper surface of the shower head.

2. The film-forming apparatus as set forth in claim 1, wherein when the flow rate of the gas mixture is large, the shower conductance is small and the gas mixture is injected into the film-forming chamber from a central portion of the shower head (hereunder referred to as "central gas injection") upon the formation of the film, wherein the shower head has a relatively large diameter, that the distance between the shower head and the substrate to be processed is increased or that the shower head having the relatively large diameter is used and the distance between the shower head and the substrate to be processed is increased, to thus prevent the central gas injection of the gas mixture and to make the manner of a gas injection of the gas mixture uniform.

3. The film-forming apparatus as set forth in claim 1, wherein when the flow rate of the gas mixture is small, the shower conductance is large and the gas mixture is injected into the film-forming chamber from the shower head and into a region above the substrate to be processed from the periphery of the shower head (hereunder referred to as "peripheral gas injection") upon the formation of the film, wherein the shower head has a relatively small diameter, that the distance between the shower head and the substrate to be processed is reduced or that the shower head having the relatively small diameter is used and the distance between the shower head and the substrate to be processed is reduced, to thus prevent the peripheral gas injection of the gas mixture and to make the manner of the gas injection of the gas mixture uniform.

4. The film-forming apparatus as set forth in claim 1, wherein an inner diameter of the film-forming chamber and a diameter of the shower head satisfy the following relation:

(diameter of the shower head)×1.5<(inner diameter of the film-forming chamber)<(diameter of the shower head)×2.5.

5. The film-forming apparatus as set forth in claim 4, wherein a pressure in the film-forming chamber, the diameter of the shower head and an overall flow rate of gases upon the formation of the film satisfy the following relations, respectively:

2 Torr<(pressure in the film-forming chamber)<10 Torr     a)

diameter of the substrate to be processed<(diameter of the shower head)×1.5 and     b)

2500 sccm<(overall flow rate of gases)<7000 sccm     c).

6. The film-forming apparatus as set forth in claim 1, wherein a pressure in the film-forming chamber, a diameter of the shower head and an overall flow rate of gases upon the formation of the film satisfy the following relations, respectively:

2 Torr<(pressure in the film-forming chamber)<10 Torr     a)

diameter of the substrate to be processed<(diameter of the shower head)×1.5 and     b)

2500 sccm<(overall flow rate of gases)<7000 sccm     c).

7. The film-forming apparatus as set forth in claim 1, wherein a clearance for exhaustion satisfies the relation represented by the following equation:

0.02 m³/s<Exhaustion Conductance<0.08 m³/s.

8. The film-forming apparatus as set forth in claim 7, wherein a pressure in the film-forming chamber, a diameter of the shower head and an overall flow rate of gases upon the formation of the film satisfy the following relations, respectively:

2 Torr<(pressure in the film-forming chamber)<10 Torr     a)

diameter of the substrate to be processed<(diameter of the shower head)×1.5 and     b)

2500 sccm<(overall flow rate of gases)<7000 sccm     c).

9. The film-forming apparatus as set forth in claim 1, wherein a gas ring is disposed at a periphery of the top face of the film-forming chamber so that an inert gas, which is not directly involved in the film formation, can uniformly be introduced into the film-forming chamber through the gas ring and along an inner surface of the side wall of the film-forming chamber.

10. A film-forming apparatus, which comprises: a load-lock chamber for stocking wafers conveyed from a wafer cassette in the atmospheric conditions; a film-forming chamber; a conveyer chamber positioned between the load-lock chamber and the film-forming chamber; a gas-mixing chamber for admixing a raw gas and a reactive gas positioned on the upstream side of the film-forming chamber; a gas mixture supply port defining a dimensionally constant clearance between a bottom portion of the gas-mixing chamber and a circular shower head and positioned at a periphery of the bottom portion of the gas-mixing chamber; a shower head arranged at a top face of the film-forming chamber and having a plurality of gas-injection holes defined therethrough, each gas-injection hole directly opposing the gas-mixture chamber; and a stage arranged in the film-forming chamber for placing a substrate to be processed and movable in an up and down manner, in which a gas mixture prepared in the gas-mixing chamber is introduced into the film-forming chamber through the shower head to thus form a film on the substrate via the gas mixture supply port which is in fluid communication with the gas-mixing chamber and the shower head and is located on a radially extending line of the shower head, wherein an exhaust port for discharging the exhaust gas from the film-forming chamber to outside of the film-forming chamber is formed through a wall surface of the film-forming chamber in a position below the stage at a time of film formation, the exhaust gas generated in a space defined by the shower head and an upper face of the stage is discharged out of the exhaust port through a clearance between a side wall of the film-forming chamber and the stage, and wherein the gas mixture supply port is so constructed and arranged that the gas mixture initially prepared in the gas-mixing chamber freely flows through the dimensionally constant clearance along an upper surface of the shower head directly from the gas mixture supply port onto the upper surface of the shower head in direct contact with, and only from outside a circumferential outer perimeter of, the upper surface of the shower head and the gas-injection holes toward a central portion along the upper surface of the shower head.

* * * * *